United States Patent
Akita et al.

(10) Patent No.: US 7,641,934 B2
(45) Date of Patent: Jan. 5, 2010

(54) PROCESS FOR THE PRODUCTION OF ENTRY SHEET FOR DRILLING AND USE THEREOF

(75) Inventors: Reiki Akita, Tokyo (JP); Shinya Komatsu, Tokyo (JP); Takuya Hasaki, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 407 days.

(21) Appl. No.: 11/806,015

(22) Filed: May 29, 2007

(65) Prior Publication Data

US 2007/0281181 A1 Dec. 6, 2007

(30) Foreign Application Priority Data

May 30, 2006 (JP) .............................. 2006-149720

(51) Int. Cl.
*B05D 3/02* (2006.01)
(52) U.S. Cl. .................... 427/96.1; 427/96.2; 427/97.1; 427/384; 427/385.5; 427/388.1; 427/388.4
(58) Field of Classification Search ........................ None
See application file for complete search history.

(56) References Cited

U.S. PATENT DOCUMENTS

| | | | | |
|---|---|---|---|---|
| 4,340,167 A | * | 7/1982 | Packer et al. | 228/180.1 |
| 5,082,402 A | * | 1/1992 | Gaku et al. | 408/1 R |
| 5,480,269 A | * | 1/1996 | Ejiri et al. | 408/1 R |
| 6,306,557 B1 | * | 10/2001 | Lin et al. | 430/288.1 |
| 6,753,300 B2 | * | 6/2004 | Eziri et al. | 508/100 |
| 6,866,450 B2 | * | 3/2005 | Hasaki et al. | 408/1 R |
| 2005/0003169 A1 | * | 1/2005 | Ikeguchi et al. | 428/195.1 |
| 2008/0166565 A1 | * | 7/2008 | Ikeguchi et al. | 428/411.1 |

* cited by examiner

*Primary Examiner*—Erma Cameron
(74) *Attorney, Agent, or Firm*—Wenderoth, Lind & Ponack, L.L.P.

(57) ABSTRACT

There are provided a process for the production of an entry sheet for drilling, comprising preparing a water-soluble resin composition solution by using a mixed solvent containing water and isopropyl alcohol in a specific ratio as a solvent of a water-soluble resin composition, then applying the solution to a sheet-like base material and drying the resultant base material to form a resin layer on the base material, and a method of drilling a printed wiring board material using the above entry sheet. According to the present invention, the problems of remaining bubbles in the resin layer and a decrease in surface flatness and smoothness due to the occurrence of a ridge, which are caused because the melting point of the water-soluble resin is lower than the boiling point of water, are overcome, and an entry sheet for drilling excellent in hole position accuracy is provided.

7 Claims, No Drawings

PROCESS FOR THE PRODUCTION OF ENTRY SHEET FOR DRILLING AND USE THEREOF

FIELD OF THE INVENTION

The present invention relates to a process for the production of an entry sheet for drilling, which is used for drilling a hole in a copper-clad laminate or the like in steps of producing printed wiring boards and a method of drilling a printed wiring board material which method uses the above entry sheet.

BACKGROUND OF THE INVENTION

As methods of drilling copper-clad laminates used for printed wiring board materials, there is generally adopted a method in which copper-clad laminates are stacked, an aluminum foil or the like is disposed on the top of the resultant stack and a hole is drilled.

In recent years, in accordance with a demand for improvement in reliability or an advance of high-densification concerning printed wiring board materials, high-quality drilling is required. For example, an improvement in hole position accuracy or a decrease in inner wall roughness is required. For coping with the above requirements, a hole-making method in which a sheet of polyethylene glycol is used (JP-A-4-92488), a lubricant sheet for making holes obtained by forming a water-soluble resin layer on a metal foil (JP-A-6-344297) and an entry sheet for making holes obtained by using an aluminum foil having a thermosetting resin thin film formed and forming a water-soluble resin layer made of a solventless water-soluble resin composition on the thermosetting resin thin film of the aluminum foil (for example, JP-A-2003-136485) have been proposed and practically adopted.

As methods for forming resin layers in these entry sheets for making holes, proposed are a method in which a resin composition is mixed with kneading means such as a roll or a kneader and a resin layer is formed on a base material by a roll process or a curtain coating process and a method in which a resin composition is molded with a press, a roll or a T-die extruder into a resin sheet having a desired thickness in advance, the resin sheet is laminated on a base material, and then the resin sheet and the base material are adhered to each other under heat with a press or a roll or bonded to each other, if necessary, with an adhesive or the like.

However, these methods have problems about the complicacy of steps, an alteration due to heat during melting, and a limitation on the range of a thickness due to difficulty in forming a thin resin layer. In regard to a method in which a low-boiling-point organic solvent solution of a water-soluble resin composition is applied and dried, there are problems about the limitation of the water-soluble resin which can be dissolved in organic solvent or the necessity of an exhaust gas treatment.

Further, a method in which an aqueous solution of a water-soluble resin composition is applied to a base material and dried to form a resin layer is also known. However, this method has a problem about a deterioration in hole position accuracy because of remaining bubbles in the resin layer or the occurrence of continuous ridges on the surface of the resin layer. In particular, when holes having a small diameter of 0.2 mm or less are drilled, the remaining bubbles or the ridges on the resin layer surface deteriorates hole position accuracy since a burden imposed on the drill in resin portions and a burden imposed in bubble portions are not uniform during drilling. Therefore, a further improvement is required.

The remaining bubbles in the resin layer or the occurrence of the continuous ridges on the resin layer surface is caused as follows. The melting points of water-soluble resins used for entry sheets are lower than the boiling point of water in many cases, so that drying due to vaporization of water and self-melting due to heat continuously occur in the step of drying of an aqueous solution of such a water-soluble resin applied to a base material and a resin layer is finally formed by cooling-solidification. Therefore, problems such as removal of bubbles in the resin layer or the formation of a flat smooth resin layer surface occur, so that it is difficult to perform stable production. With regard to a water-soluble resin having a melting point higher than the boiling point of water, on the other hand, a drill-cooling effect due to melting is low during drilling, so that the effect of such a resin is low as a resin for entry sheets.

SUMMARY OF THE INVENTION

It is an object of the present invention to overcome, concerning a process for the production of an entry sheet for drilling comprising applying an aqueous solution of a water-soluble resin composition to a base material and drying the applied solution to prepare a resin layer, the problem of remaining bubbles in the resin layer and the problem of a decrease in surface flatness and smoothness due to the occurrence of a ridge, which are caused because the melting point of a water-soluble resin is lower than the boiling point of water, drying due to evaporation of water and self-melting due to heat continuously occur during drying after the application and the resin layer is finally formed by cooling-solidification, and to provide a process for the production of an entry sheet for drilling which comprises applying an aqueous solution of a water-soluble resin composition to a base material and drying the applied solution to prepare a resin layer and can give an entry sheet excellent in escape of bubbles from the resin layer, in the flatness and smoothness of a resin layer surface and in hole position accuracy, and a method of drilling a printed wiring board material which method uses the above entry sheet.

The present inventors have made various studies for attaining the above object and as a result found that a resin layer from which bubbles have sufficiently escaped and of which the surface is flat and smooth can be obtained by jointly using water and isopropyl alcohol as a solvent of a water-soluble resin composition. Accordingly, the present inventors have arrived at the present invention.

That is, the present invention provides a process for the production of an entry sheet for drilling, comprising dissolving a resin composition containing a water-soluble resin (a) (to be sometimes referred to as "water-soluble resin (a)-containing resin composition" hereinafter) in a mixed solvent comprising water and isopropyl alcohol and having a water:isopropyl alcohol mixing ratio of 60:40 to 95:5 (% by weight) to obtain a solution, then applying the solution to a sheet-like base material and drying the applied solution, thereby forming a resin layer on the base material.

The water-soluble resin (a) used in the present invention is preferably a resin or at least two resins selected from the group consisting of polyethylene oxide, polypropylene oxide, sodium polyacrylate, polyacrylamide, polyvinyl pyrrolidone, carboxymethyl cellulose, polytetramethylene glycol and polyether ester.

The water-soluble resin (a)-containing resin composition is preferably a resin composition containing the water-soluble resin (a) and a water-soluble lubricant (b) or at least two water-soluble lubricants (b) selected from the group consisting of polyethylene glycol, polypropylene glycol, monoether of polyoxyethylene, ester of polyoxyethylene, polyoxyethylene sorbitan monostearate, polyglycerine monostearate, a polyoxyethylene propylene copolymer and derivatives of these.

In more preferred embodiments of the process for the production of an entry sheet for drilling, provided by the present invention, the thickness of the resin layer is 5 to 200 μm, the base material is an aluminum foil, the aluminum foil is an aluminum foil having a preformed 0.1 to 10 μm-thick coating film for adhesion, and the resin layer is formed on the preformed coating film of the aluminum foil. Further, the present invention provides a method of drilling a printed wiring board material, comprising disposing an entry sheet for drilling obtained by the above process on the printed wring board material such that a base material surface side of the entry sheet is brought into contact with the printed wiring board material and drilling a hole in the printed wiring board material from a resin layer surface side of the entry sheet.

EFFECT OF THE INVENTION

An entry sheet for drilling obtained according to the process for the production of an entry sheet for drilling, provided by the present invention, has an advantage that the entry sheet has a flat and smooth resin layer surface without any ridges and is excellent in hole position accuracy because the escape of bubbles from the resin layer is good. More specifically, there is an advantage that the process of the present invention suppresses the occurrence of a ridge on the resin layer surface which causes a deterioration in hole position accuracy or the occurrence of remaining bubbles which also causes a deterioration in hole position accuracy because of nonuniformity between a burden imposed on the drill in resin portions and a burden imposed in bubble portions during drilling in the formation of holes having a small diameter of 0.2 μm or less. Further, according to the above process for the production of an entry sheet for drilling, stable production of an entry sheet having a small resin layer thickness is possible, so that it becomes possible to stably produce an entry sheet for drilling which is suited for making a small-diameter hole.

DETAILED DESCRIPTION OF THE INVENTION

The water-soluble resin (a) used in the present invention is not specially limited so long as it is a high molecular compound which is soluble in water at normal temperature under normal pressure. The water-soluble resin (a) is preferably a water-soluble resin having a low melting point. More preferred examples of the water-soluble resin (a) include polyethylene oxide, polypropylene oxide, sodium polyacrylate, polyacrylamide, polyester polyol, polyvinyl pyrrolidone, carboxymethyl cellulose, polytetramethylene glycol and polyether ester. The water-soluble resin (a) may be used singly or at least two water-soluble resins (a) may be mixed and used as required.

The polyether ester, which is usable as the water-soluble resin (a) used in the present invention, is not specially limited so long as it is an esterificated product of polyalkylene oxide. A typical example thereof is a resin obtained by reacting a polymer of glycol or ethylene oxide with a polycarboxylic acid, its anhydride or its ester. Examples of the polymer of glycol or ethylene oxide include polyethelene glycol, polyethylene oxide, polypropylene glycol, polytetramethylene glycol, polypropylene oxide and copolymers of these. Examples of the polycarboxylic acid, its anhydride or its ester include phthalic acid, isophthalic acid, terephthalic acid, sebacic acid, dimethyl esters and diethyl esters of these, and pyromellitic acid anhydride. The polyether ester may be used singly or at least two polyether esters may be mixed and used as required.

The water-soluble resin (a)-containing resin composition used in the present invention preferably contains a water-soluble resin (a) and a water-soluble lubricant (b). Specific examples of the water-soluble lubricant (b) include polyethylene glycol, polypropylene glycol; monoethers of polyoxyethylene such as polyoxyethylene oleyl ether, polyoxyethylene cetyl ether, polyoxyethylene stearyl ether, polyoxyethylene lauryl ether, polyoxyethylene nonylphenyl ether and polyoxyethylene octylphenyl ether; polyoxyethylene monostearate, polyoxyethylene sorbitan monostearate; polyglycerin monostearates such as hexaglycerin monostearate and decahexaglycerin monostearate; a polyoxyethylene propylene copolymer, and derivatives of these. The water-soluble lubricant (b) may be used singly or at least two water-soluble lubricants (b) may be mixed and used as required. The amount of the water-soluble lubricant (b) per 100 parts by weight of the total amount of the water-soluble resin (a) and the water-soluble lubricant (b) is preferably 10 to 90 parts by weight, more preferably 20 to 80 parts by weight. When the amount of the water-soluble lubricant (b) is smaller than 10 parts by weight, a viscosity becomes too high and a problem is apt to occur in lubricity during drilling. When it exceeds 90 parts by weight, the resin layer becomes fragile.

In the present invention, the water-soluble resin (a)-containing resin composition is dissolved in a mixed solvent of water and isopropyl alcohol to prepare a resin solution. The water-isopropyl alcohol mixing ratio (% by weight) in the mixed solvent is 60:40 to 95:5, preferably 65:35 to 90:10. When the amount of the isopropyl alcohol in the mixed solvent is lower than the lower limit of the above range, a viscosity is apt to become high. When it exceeds the upper limit, the water-soluble resin (a) is apt to precipitate. Further, it is possible to jointly use, as a diluent, a different solvent which is compatible with water such as a different alcohol typified by methanol or ethanol or a ketone typified by acetone or methyl ethyl ketone, as required.

The solid matter concentration in the resin solution in the present invention is preferably 10% by weight or more, more preferably 20 to 40% by weight. When the solid matter concentration is smaller than 10% by weight, a change in resin layer thickness between before and after drying is large so that the thickness is apt to uneven. When it exceeds 40% by weight, the viscosity of the resin solution becomes high so that a problem occurs when a thin resin layer, in particular a resin layer having a thickness of less than 30 μm, is expected.

A method of preparing the resin solution by dissolving the water-soluble resin (a)-containing resin composition in the mixed solvent of water and isopropyl alcohol is not specially limited so long as it is a known industrially-used method. Specifically, for example, there are a method in which a water-soluble resin (a)-containing resin composition is properly warmed or heated using a roll or a kneader or different kneading means to prepare a uniform mixture and then the mixture is dissolved in a mixed solvent of water and isopropyl alcohol to prepare a resin solution and a method in which a water-soluble resin (a)-containing resin composition, water and isopropyl alcohol are added to a container equipped with a stirring blade or a planetary type stirrer and the resin composition is dissolved in the water and isopropyl alcohol to prepare a resin solution. Moreover, another example is a method in which a water-soluble resin (a)-containing resin composition is dissolved in water and then isopropyl alcohol is mixed therewith to prepare a mixed solvent solution.

The sheet-like base material used in the present invention is not specially limited so long as it is a known sheet-like base material such as a metal foil, an organic film or an organic sheet. In particular, an aluminum foil is preferred. In view of the substance of the aluminum foil, an aluminum having a purity of 95% or more is preferred. Specifically, examples thereof include 5052, 3004, 3003, 1N30, 1050, 1070 and 1085, defined in JIS-H4160. An aluminum having a purity of 99.3% or more is more preferred. The use of a high-purity aluminum foil as the base material lightens the shock of a drill bit and improves biting properties and, in addition, the water-soluble resin (a)-containing resin composition has an effect of lightening the heat generation of a drill bit due to frictional heat, so that great improvements in position accuracy at the time of drilling and hole quality are possible. In view of adhesion to the water-soluble resin (a)-containing resin composition, it is most preferred to use an aluminum foil obtained by forming a coating film for adhesion having a thickness of 0.1 to 10 μm on any one of these aluminum foils. Examples of an adhesive used for the coating film for adhesion include urethane adhesives, vinyl acetate adhesives, vinyl chloride adhesives, polyester adhesives, copolymers of these, epoxy adhesives and cyanate adhesives. The thickness of the base material is preferably in the range of from 50 to 500 μm. When the thickness is smaller than 50 μm, burrs are apt to occur in a laminate after drilling. When the thickness exceeds 500 μm, it is difficult to discharge a powder of a chip generated.

In the present invention, a method of applying the above resin solution to the sheet-like base material is not specially limited so long as it is a known industrially-used method. Specifically, it is typically a method in which a coating layer is formed on a base material with a knife coater, a die coater or the like and the solvent is evaporated by hot-air drying in a drying furnace. For the above application, an adequate viscosity of the resin solution is 1,000 to 30,000 centipoises (25° C.), more preferably 5,000 to 20,000 centipoises (25° C.). When the solution viscosity is lower than 1,000 centipoises, the expected resin layer thickness becomes insufficient or a pattern like a wind-wrought pattern arises on the surface in the drying step. When it is higher than 30,000 centipoises, the thickness of the resin layer becomes too thick or continuous ridges arise on the surface or bubbles remain in the resin layer.

A method of forming the resin layer on the sheet-like base material by drying the sheet-like base material on which the coating layer has been formed is not specially limited so long as it is a known industrially-used method. Specifically, hot-air drying is adopted in many cases. Heating by an infrared ray, a microwave or a high-frequency wave is jointly used as required. Conditions for the drying depend on the size and performance of a drying machine, an expected resin layer thickness and a coating speed. For example, in the case where a drying zone is separated into three portions, it is preferred to select conditions where the temperature for the drying is gradually increased from 60° C., then 90° C. to 120° C. from the side of the entrance of the furnace such that a difference between the temperature of a portion in the drying furnace and the temperature of the base material in that portion does not become so large, and finally the temperature of the base material reaches 100° C. or higher to complete the removal of water content. In this case, if a high temperature is used in the entrance side portion, the surface portion is firstly dried so that, when the solvent inside the resin layer is evaporated, a bubbling phenomenon is apt to occur and the appearance deteriorates in some cases.

The thickness of the resin layer of the sheet-like base material, on which the coating layer has been formed, after drying is preferably in the range of from 5 to 200 μm. When the thickness of the resin layer after drying is smaller than 5 μm, roughness of a wall surface of a processed hole obtained increases due to insufficient lubricity. When it exceeds 200 μm, a drill bit is easily wrapped with the resin layer in the formation of small-diameter holes, which deteriorates hole position accuracy. As a method of controlling the thickness of the resin layer after drying, for example, there are a method in which the thickness is adjusted depending on a coating layer amount in accordance with each coating method, a method in which the thickness is adjusted according to the solid matter concentration of the resin solution unless the viscosity of the resin solution is out of the viscosity range desirable for each coating method, and a method in which both of the above methods are adopted in combination. According to the process explained hereinabove, an entry sheet for drilling is obtained.

In the method of drilling a printed wiring board material, provided by the present invention, an entry sheet for drilling obtained by the above process is disposed on the top surface of a printed wiring board material such as a copper-clad laminate or a multilayer board such that a base material surface of the entry sheet is brought into contact with the printed wiring board material and a hole is drilled in the printed wiring board material from the side of a resin layer surface of the entry sheet.

EXAMPLES

The present invention will be explained in detail with reference to Examples and Comparative Examples hereinafter.

Example 1

50 parts by weight of polyethyleneglycol dimethyl terephthalate polycondensate (trade name: Paogen PP-15, supplied by DAI-ICHI KOGYO SEIYAKU CO., LTD.) and 50 parts by weight of polyoxyethylene monostearate (trade name: Nonion S-40, supplied by NOF CORPORATION) were kneaded with a kneader in a nitrogen atmosphere at 150° C. Then, the kneaded mixture was dissolved in 230 part by weight of water in a stirring vessel. Then, 35 parts by weight of isopropyl alcohol was added, to obtain a resin solution having a solid matter concentration of 27.4% and a viscosity of 16000 centipoises (25° C.). The resin solution was applied with a die coater to one surface of an aluminum foil (substance: 1070) having a thickness of 100 μm and having a preformed 5 μm-thick coating film made of a polyester adhesive (trade name: R820, supplied by CEMEDINE Co., Ltd.), to form a coating layer having a thickness of 330 μm. The aluminum foil with the coating layer was dried by passing it, at a rate of 0.1 m/sec, through a roll support type drying furnace having three rooms each of which had a length of 3 m (setting temperatures: 60-100-140° C.) under conditions where hot air blew against the upper surface at a wind speed of 20 m/min, thereby obtaining an entry sheet for drilling having a total thickness of 200 μm. The thus-obtained entry sheet for drilling was disposed on the top surface of a stack of two copper-clad laminates each of which had a thickness of 0.4 mm and had 12 μm-thick coppers on both surfaces (trade name: HL832 0.4 T/T, supplied by Mitsubishi Gas Chemical Co., Inc.) such that the base material surface side of the entry sheet faced to the top surface. A patch board (paper phenol laminate) was disposed on the bottom surface of the above stack. Drilling by 3,000 hits was performed under conditions of a drill bit: 0.15φ (trade name: NEUL004S, supplied by UNION TOOL CO), a revolution speed: 150,000 rpm and a feeding speed: 12 μm/rev. The above operation was repeated three times. Holes were evaluated. Table 1 shows the results thereof.

Example 2

40 parts by weight of polyethyleneglycol dimethyl terephthalate polycondensate (Paogen PP-15) and 60 parts by weight of polyoxyethylene monostearate (Nonion S-40) were dissolved in 180 part by weight of water in a stirring vessel. Then, 80 parts by weight of isopropyl alcohol was added, to obtain a resin solution having a solid matter concentration of 27.8% and a viscosity of 14000 centipoises (25° C.). The resin solution was applied with a die coater to one surface of an aluminum foil (substance: 1N30) having a thickness of 100 μm and having a preformed 5 μm-thick coating film made of a polyester adhesive (R820), to form a coating layer having a thickness of 330 μm. The aluminum foil with the coating layer was dried by passing it, at a rate of 0.1 m/sec, through a roll-support type drying furnace having three rooms each of which had a length of 3 m (setting temperatures: 60-100-140° C.) under conditions where hot air blew against the top surface at a wind speed of 20 m/min, thereby obtaining an entry sheet for drilling having a total thickness of 200 μm. Thereafter, drilling was carried out in the same manner as in Example 1 except that the thus-obtained entry sheet was used. Holes were evaluated. Table 1 shows the results thereof.

Comparative Example 1

50 parts by weight of polyethyleneglycol dimethyl terephthalate polycondensate (Paogen PP-15) and 50 parts by weight of polyoxyethylene monostearate (Nonion S-40) were dissolved in 270 part by weight of water in a stirring vessel, to obtain a resin solution having a solid matter concentration of 27% and a viscosity of 32000 centipoises (25° C.). The resin solution was applied to one surface of an aluminum foil (1070) having a thickness of 100 μm with a die coater, to form a coating layer having a thickness of 370 μm. The aluminum foil with the coating layer was dried under the same conditions as those in Example 1, thereby obtaining an entry sheet for drilling having a total thickness of 200 μm. Myriad air bubbles were found in the resin layer of the thus-obtained entry sheet by visual observation. Drilling was carried out under the same conditions as those in Example 1 except that the thus-obtained entry sheet was used. Holes were evaluated. Table 1 shows the results thereof.

TABLE 1

Hole position accuracy comparison (unit: μm)

| | Example 1 | | Example 2 | | Comparative Example 1 | |
|---|---|---|---|---|---|---|
| | MAX | Ave + 3σ | MAX | Ave + 3σ | MAX | Ave + 3σ |
| First drilling | 38 | 20 | 32 | 22 | 76 | 34 |
| Second drilling | 38 | 22 | 26 | 21 | 88 | 37 |
| Third drilling | 28 | 20 | 35 | 23 | 90 | 35 |

Example 3

20 parts by weight of polyethyleneglycol dimethyl terephthalate polycondensate (Paogen PP-15), 20 parts by weight of polyethylene glycol (trade name: PEG20000, supplied by Sanyo Chemical Industries, Ltd.) and 60 parts by weight of polyoxyethylene monostearate (Nonion S-40) were dissolved in 280 part by weight of water in a stirring vessel. Then, 40 parts by weight of isopropyl alcohol was added, to obtain a resin solution having a solid matter concentration of 23.8% and a viscosity of 7000 centipoises (25° C.). The resin solution was applied to one surface of an aluminum foil (1070) having a thickness of 70 μm with a die coater, to form a coating layer having a thickness of 43 μm. The resultant aluminum foil was passed, at a rate of 0.07 m/sec, through a roll-support type drying furnace having three rooms each of which had a length of 3 m (setting temperatures: 60-90-120° C.) under conditions where hot air blew against the upper surface at a wind speed of 15 m/min, thereby obtaining an entry sheet for drilling having a total thickness of 80 μm. The thus-obtained entry sheet for drilling was disposed on the top surface of a stack of four copper-clad laminates each of which had a thickness of 0.2 mm and had 12 μm-thick coppers on both surfaces (trade name: HL832 0.2 T/T, supplied by Mitsubishi Gas Chemical Co., Inc.) such that the base material surface side of the entry sheet faced to the top surface of the stack. A patch board (paper phenol laminate) was disposed on the bottom surface of the above stack. Drilling by 3,000 hits was performed under conditions of a drill bit: 0.105φ (trade name: MD J 492B, supplied by UNION TOOL CO), a revolution speed: 160,000 rpm and a feeding speed: 5 μm/rev. The above operation was repeated three times. Holes were evaluated. Table 2 shows the results thereof.

Comparative Example 2

20 parts by weight of polyethyleneglycol dimethyl terephthalate polycondensate (Paogen PP-15), 20 parts by weight of polyethylene glycol (PEG20000) and 60 parts by weight of polyoxyethylene monostearate (Nonion S-40) were dissolved in 165 part by weight of water in a stirring vessel. Then, 150 parts by weight of isopropyl alcohol was added, to obtain a resin solution having a solid matter concentration of 24.1% and a viscosity of 4000 centipoises (25° C.). The resin solution was applied to one surface of an aluminum foil (1070) having a thickness of 70 μm with a die coater, to form a coating layer having a thickness of 43 μm. The resultant aluminum foil was passed, at a rate of 0.07 m/sec, through a roll-support type drying furnace having three rooms each of which had a length of 3 m (setting temperatures: 60-90-120° C.) under conditions where hot air blew against the upper surface at a wind speed of 15 m/min, thereby obtaining an entry sheet for drilling having a total thickness of 80 μm. Ridges parallel with the direction of the application were found on the surface of the resin layer of the thus-obtained entry sheet by visual observation. Drilling was carried out under the same conditions as those in Example 3 except that the above-obtained entry sheet was used. Holes were evaluated. Table 2 shows the results thereof.

TABLE 2

Hole position accuracy comparison (unit: μm)

|  | Example 3 | | Comparative Example 2 | |
| --- | --- | --- | --- | --- |
|  | MAX | Ave + 3σ | MAX | Ave + 3σ |
| First drilling | 18 | 15 | 38 | 31 |
| Second drilling | 18 | 14 | 35 | 31 |
| Third drilling | 18 | 16 | 35 | 30 |

(Measurement Method for Hole Evaluation)

Hole position accuracy: In regard to a bottom surface of a bottom laminate of stacked copper-clad laminates, three bits×3,000 holes/bit=9,000 holes were measured for displacement from instructed coordinates, and an average, a standard deviation (σ) and a maximum were obtained. Hole position accuracy is represented by Maximum and Average+3σ.

What is claimed is:

1. A process for the production of an entry sheet for drilling, comprising dissolving a resin composition containing a water-soluble resin (a) in a mixed solvent comprising water and isopropyl alcohol and having a water: isopropyl alcohol mixing ratio of 60:40 to 95:5, % by weight, to obtain a solution, then applying the solution to a sheet base material and drying the applied solution, thereby forming a resin layer on the base material.

2. A process according to claim 1, wherein the water-soluble resin (a) is at least one resin selected from the group consisting of polyethylene oxide, polypropylene oxide, sodium polyacrylate, polyacrylamide, polyvinyl pyrrolidone, carboxymethyl cellulose, polytetramethylene glycol and polyether ester.

3. A process according to claim 1, wherein the resin composition is a resin composition which contains the water-soluble resin (a) and at least one water-soluble lubricant (b) selected from the group consisting of polyethylene glycol, polypropylene glycol, monoether of polyoxyethylene, ester of polyoxyethylene, polyoxyethylene sorbitan monostearate, polyglycerine monostearate, a polyoxyethylene propylene copolymer and derivatives of these.

4. A process according to claim 1, wherein the thickness of the resin layer is 5 to 200 μm.

5. A process according to claim 1, wherein the base material is an aluminum foil.

6. A process according to claim 5, wherein the aluminum foil is an aluminum foil having a preformed coating film for adhesion having a thickness of 0.1 to 10 μm.

7. A method of drilling a printed wiring board material, comprising disposing an entry sheet for drilling obtained by the process defined in claim 1 on the printed wiring board material such that a base material surface of the entry sheet is brought into contact with the printed wiring board material and drilling a hole in the printed wiring board material from a resin layer surface side of the entry sheet.

* * * * *